(12) United States Patent
Denda et al.

(10) Patent No.: US 10,798,815 B2
(45) Date of Patent: Oct. 6, 2020

(54) PROTECTION CIRCUIT MODULE AND ELECTRONIC DEVICE

(71) Applicants: SHINKO ELECTRIC INDUSTRIES CO., LTD., Nagano (JP); NIHON KOHDEN CORPORATION, Tokyo (JP)

(72) Inventors: Tatsuaki Denda, Nagano (JP); Norihito Konno, Tokyo (JP); Minori Hosoi, Tokyo (JP)

(73) Assignees: SHINKO ELECTRIC INDUSTRIES CO., LTD., Nagana (JP); NIHON KOHDEN CORPORATION, Tokyo (JP)

( * ) Notice: Subject to any disclaimer, the term of this patent is extended or adjusted under 35 U.S.C. 154(b) by 168 days.

(21) Appl. No.: 16/213,056

(22) Filed: Dec. 7, 2018

(65) Prior Publication Data
US 2019/0200448 A1    Jun. 27, 2019

(30) Foreign Application Priority Data
Dec. 21, 2017   (JP) ................... 2017-245577

(51) Int. Cl.
*H05K 1/00*   (2006.01)
*H05K 1/11*   (2006.01)
(Continued)

(52) U.S. Cl.
CPC ......... *H05K 1/0216* (2013.01); *H05K 1/0218* (2013.01); *H05K 1/113* (2013.01);
(Continued)

(58) Field of Classification Search
CPC .. H05K 1/0216; H05K 1/0257; H05K 1/0218; H05K 1/113; H05K 1/181;
(Continued)

(56) References Cited

U.S. PATENT DOCUMENTS

2005/0184372 A1* 8/2005 Asahi ............... H05K 1/148
257/678
2008/0315375 A1* 12/2008 Eichelberger ......... H05K 3/30
257/659

(Continued)

FOREIGN PATENT DOCUMENTS

JP    2003-289268    10/2003

*Primary Examiner* — Gary L Laxton
(74) *Attorney, Agent, or Firm* — IPUSA, PLLC

(57) ABSTRACT

A protection circuit module includes an insulating substrate, a first surge withstand chip resistor mounted on a pair of first pads formed on one surface of the insulating substrate, a second surge withstand chip resistor mounted on a pair of second pads formed on the other surface of the insulating substrate, and arranged at a position on the other surface of the insulating substrate overlapping the first surge withstand chip resistor in a plan view, a first wiring coupled to one first pad, a second wiring coupled to one second pad, a third wiring coupling the other first pad and the other second pad to the same potential, and a shield wiring provided on an inner layer of the insulating substrate and arranged in a region in which at least the one first pad and the one second pad oppose each other.

18 Claims, 7 Drawing Sheets

(51) Int. Cl.
*H05K 1/02* (2006.01)
*H05K 1/18* (2006.01)
(52) U.S. Cl.
CPC ........... *H05K 1/0257* (2013.01); *H05K 1/181* (2013.01); *H05K 2201/0723* (2013.01); *H05K 2201/09672* (2013.01); *H05K 2201/10022* (2013.01); *H05K 2201/10545* (2013.01)
(58) Field of Classification Search
CPC . H05K 2201/0723; H05K 2201/09672; H05K 2201/10022; H05K 2201/10545
See application file for complete search history.

(56) References Cited

U.S. PATENT DOCUMENTS

2013/0063843 A1* 3/2013 Chen .................. H01L 25/0652
361/56
2016/0056444 A1* 2/2016 Hwang ................ H02J 7/0029
429/7

\* cited by examiner

PROTECTION CIRCUIT MODULE AND ELECTRONIC DEVICE

CROSS-REFERENCE TO RELATED APPLICATION

This application is based upon and claims priority to Japanese Patent Application No. 2017-245577, filed on Dec. 21, 2017, the entire contents of which are incorporated herein by reference.

FIELD

Certain aspects of the embodiments discussed herein are related to a protection circuit module and an electronic device.

BACKGROUND

Various circuit modules, including high-frequency circuit modules or the like used in mobile communication devices, have been developed. A protection circuit module, interposed between two modules, and having a function to protect a peripheral circuit, is one of such circuit modules.

Recently, there are increased demands to reduce the size of the protection circuit module. Measures against crosstalk between wirings become more important as the size of the protection circuit module is further reduced.

Japanese Laid-Open Patent Publication No. 2003-289268, now Japanese Patent No. 4005829, is one example of prior art.

SUMMARY

Accordingly, it is an object in one aspect of the embodiments to provide a protection circuit module and an electronic device, that can reduce the crosstalk between the wirings.

According to one aspect of the embodiments, a protection circuit module includes an insulating substrate including one surface, and another surface opposite to the one surface; a first surge withstand chip resistor mounted on a pair of first pads formed on the one surface of the insulating substrate; a second surge withstand chip resistor mounted on a pair of second pads formed on the other surface of the insulating substrate, and arranged at a position on the other surface of the insulating substrate overlapping the first surge withstand chip resistor in a plan view; a first wiring coupled to one of the pair of first pads; a second wiring coupled to one of the pair of second pads; a third wiring coupling the other of the pair of first pads and the other of the pair of second pads to the same potential; and a shield wiring, provided on an inner layer of the insulating substrate, and arranged in a region in which at least the one of the pair of first pads and the one of the pair of second pads oppose each other.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
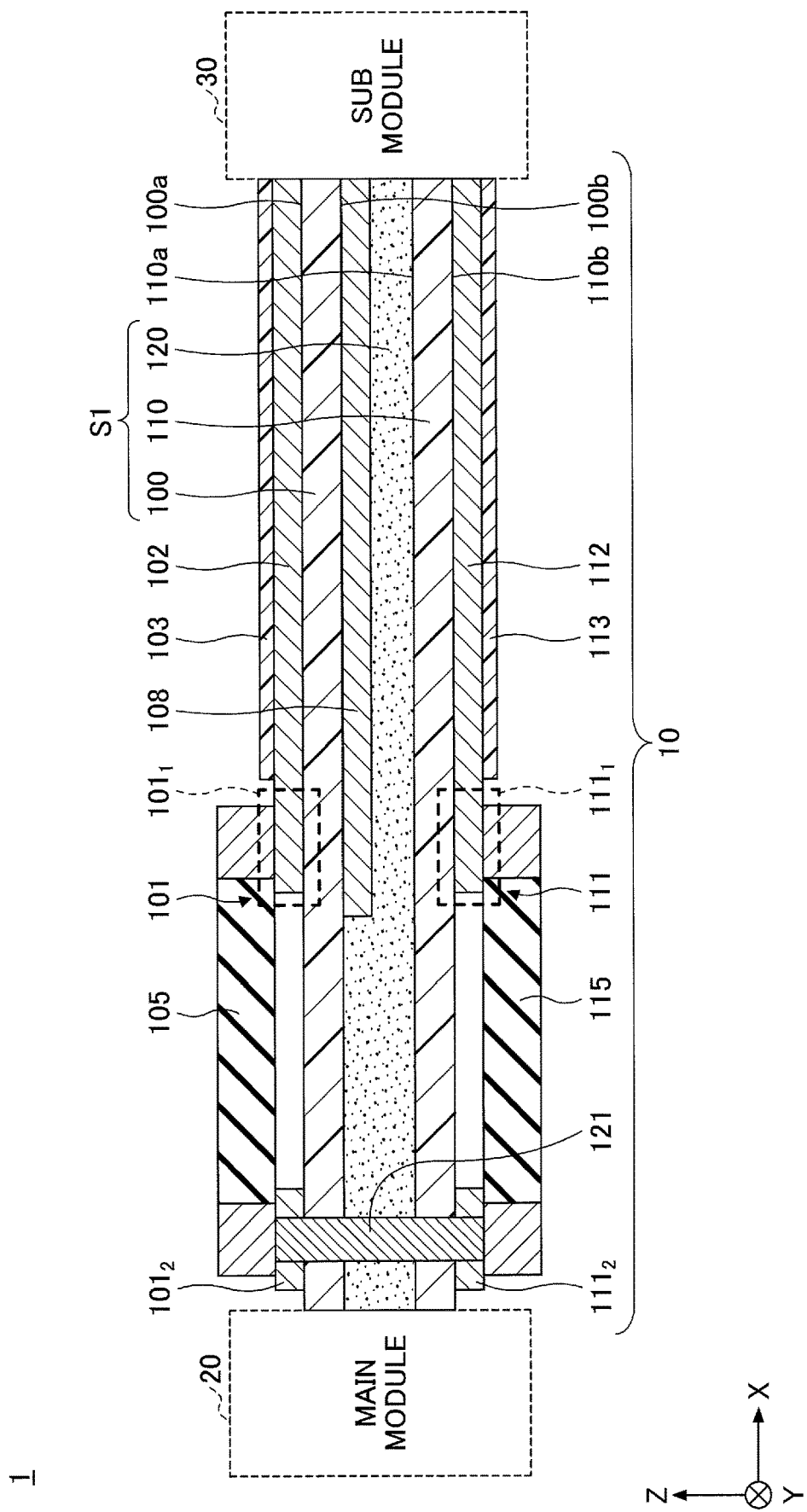
FIG. 1 is a cross sectional view illustrating an example of an electronic device in a first embodiment.

Preferred embodiments of the present invention will be described with reference to the accompanying drawings. In the drawings, those parts that are the same are designated by the same reference numerals, and a repeated description of the same parts may be omitted.

A description will now be given of a protection circuit module and an electronic device in each embodiment according to the present invention.

First Embodiment

Figure 2:
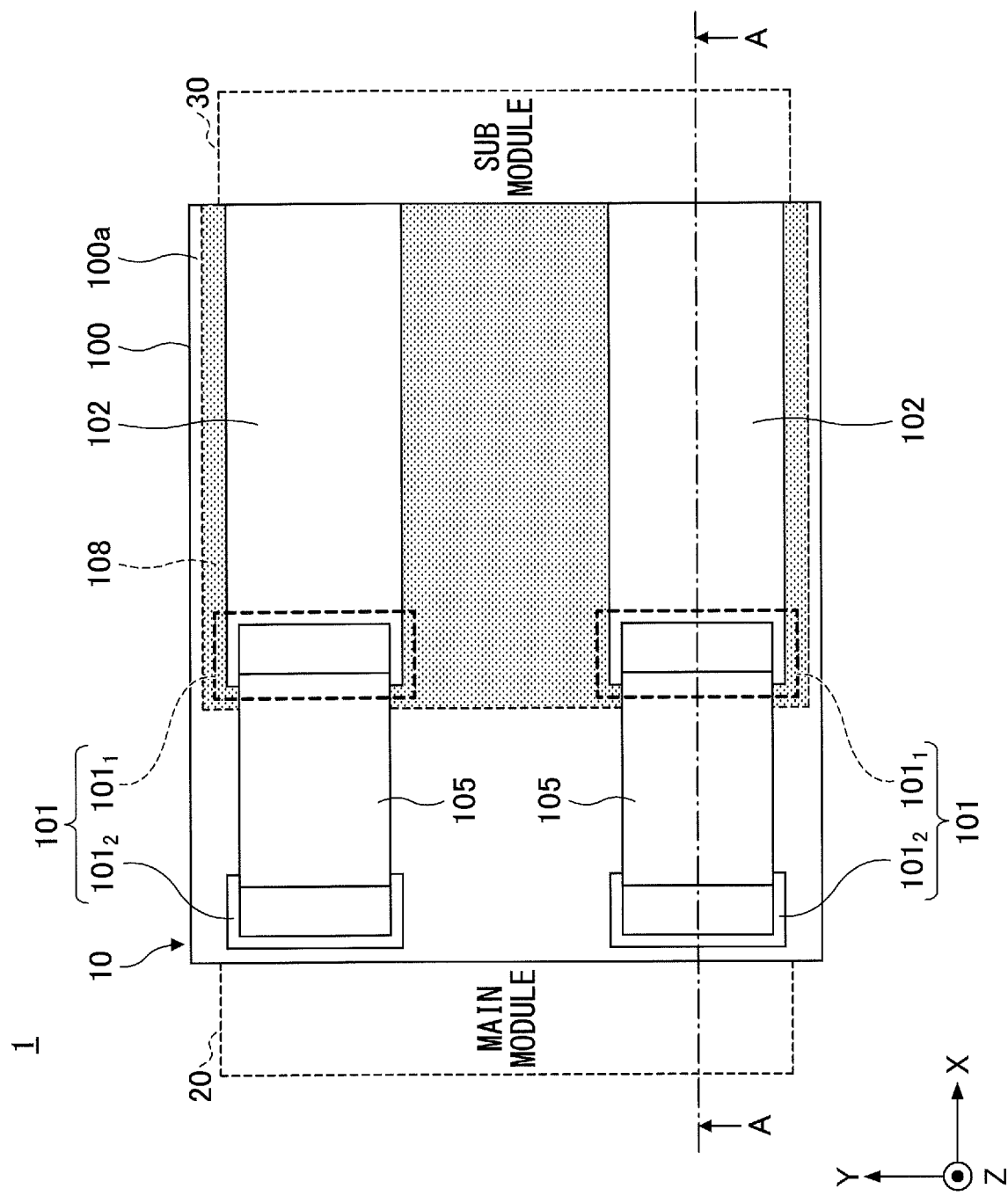
FIG. 2 is a plan view illustrating the example of the electronic device in the first embodiment.
Figure 3:
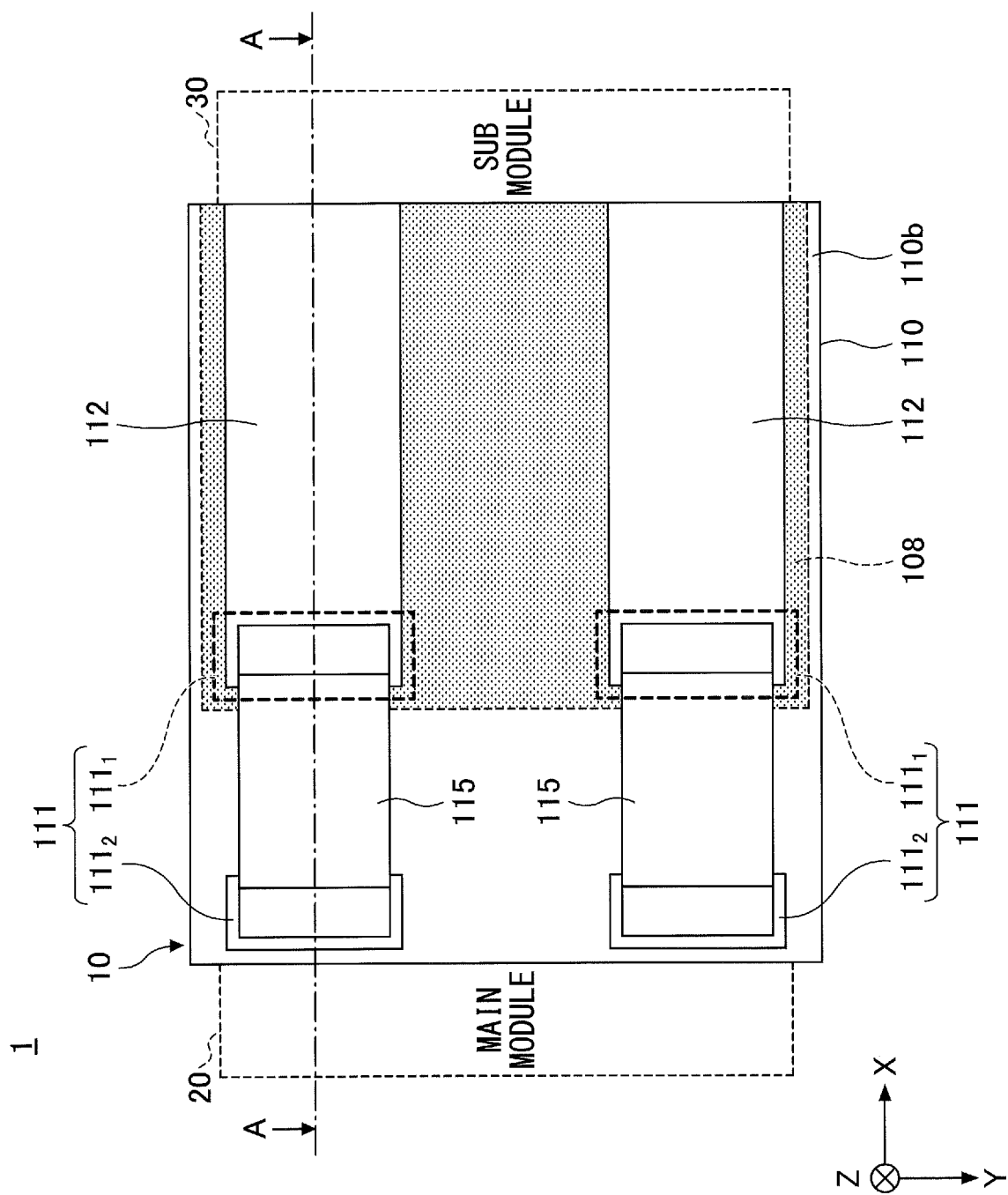
FIG. 3 is a bottom view illustrating the example of the electronic device in the first embodiment.

FIG. 1 is a cross sectional view illustrating an example of the electronic device in a first embodiment. FIG. 2 is a plan view illustrating the example of the electronic device in the first embodiment. FIG. 3 is a bottom view illustrating the example of the electronic device in the first embodiment. FIG. 1 illustrates the cross section along a line A-A in FIG. 2 and FIG. 3. Further, in FIG. 2 and FIG. 3, the illustration of solder resist layers 103 and 113 is omitted, while a shield wiring that forms an inner layer is illustrated by a textured pattern. The bottom view of the electronic device in the first embodiment illustrated in FIG. 3 is viewed in a normal direction to another surface 110b of an insulator layer 110.

As illustrated in FIG. 1 through FIG. 3, an electronic device 1 includes a protection circuit module 10, a main module 20, and a sub module 30. The electronic device 1 may include other constituent elements, such as a power source, a connector, a cable, or the like, if necessary. The protection circuit module 10 is interposed between the main module 20 and the sub module 30, and is electrically connected to the main module 20 and the sub module 30. However, the protection circuit module 10 may be detachably provided with respect to each of the main module 20 and the sub module 30.

The protection circuit module 10 includes a function to protect a peripheral circuit when a large instantaneous current flows. The protection circuit module 10 includes an insulator layer 100, pads 101, a wiring 102, the solder resist layer 103, a surge withstand chip resistor 105, a shield wiring 108, an insulator layer 110, pads 111, a wiring 112, the solder resist layer 113, a surge withstand chip resistor 115, an insulator layer 120, and a wiring 121. For the sake of convenience, a stacked structure in which the insulator layer 100, the insulator layer 110, and the insulator layer 120 are stacked, may also be referred to as an insulating substrate S1.

For the sake of convenience in this embodiment, an end of the protection circuit module 10 on a side closer to the solder resist layer 103 is regarded as an upper end or one end, and an end of the protection circuit module 10 on a side closer to the solder resist layer 113 is regarded as a lower end or the other end. In addition, a surface of each part on a side closer to the solder resist layer 103 may also be referred to as one surface or an upper surface, and a surface of each part on a side closer to the solder resist layer 113 may also be referred to as the other surface or a lower surface. Of course, the protection circuit module 10 may be used in a state that is upside-down compared to a state illustrated in FIG. 1. In addition, the protection circuit module 10 may be used in a state that is tilted or inclined by a predetermined angle from the state illustrated in FIG. 1. Further, a plan view of a target object refers to a view of the target object that is viewed in a normal direction to one surface $110a$ of the insulator layer 110. A planar shape of the target object refers to a shape of the target object that is viewed in the normal direction to the one surface $110a$ of the insulator layer 110.

The insulator layer 100 is formed by a flexible insulating resin, such as a polyimide resin or the like, for example. The insulator layer 100 may have a thickness of approximately 10 μm to approximately 50 μm, for example.

The pads 101 and the wiring 102 are formed on one surface $100a$ of the insulator layer 100 (one surface of the insulating substrate S1). The pads 101 include a pair of pads $101_1$ and $101_2$ for mounting a two-terminal electronic component having two terminals. The surge withstand chip resistor 105 is mounted on the pads 101 using solder, conductive paste, or the like, not illustrated in FIG. 1. One of the pads 101, namely, the pad $101_1$, is electrically connected to the wiring 102. The pads 101 and the wiring 102 may be made of a material such as copper (Cu) or the like, for example. The pads 101 and the wiring 102 may have a thickness of approximately 10 μm to approximately 30 μm, for example. Gold (Au) plating or the like may be provided on the surfaces of the pads 101 and the wiring 102, if necessary.

The solder resist layer 103 is formed on the one surface $100a$ of the insulator layer 100, so as to cover the wiring 102. As described above, however, the illustration of the solder resist layer 103 is omitted in FIG. 2. The solder resist layer 103 may be made of a photosensitive material such as an epoxy insulating resin, an acrylic insulating resin, or the like, for example. The solder resist layer 103 may have a thickness of approximately 10 μm to approximately 30 μm, for example.

The shield wiring 108 is formed on another surface $100b$ of the insulator layer 100. The shield wiring 108 is formed to overhang more toward the main module 20 than the pads $101_1$ and $111_1$. The shield wiring 108 is connected to a reference potential of the main module 20 and/or the sub module 30, that is, connected to the reference potential of at least one of the main module 20 and the sub module 30. The reference potential refers to a potential of ground (GND) or a power source, or a stable potential according to the ground or power source potential. The shield wiring 108 may be made of a material such as copper (Cu) or the like, for example. The shield wiring 108 may have a thickness of approximately 10 μm to approximately 30 μm, for example.

The insulator layer 110 is formed by a flexible insulating resin, such as a polyimide resin or the like, for example. The insulator layer 110 may have a thickness of approximately 10 μm to approximately 50 μm, for example.

The pads 111 and the wiring 112 are formed on the other surface $110b$ of the insulator layer 110 (another surface of the insulating substrate S1). The pads 111 include a pair of pads $111_1$ and $111_2$ for mounting a two-terminal electronic component having two terminals. The surge withstand chip resistor 115 is mounted on the pads 111 using solder, conductive paste, or the like, not illustrated in FIG. 1. One of the pads 111, namely, the pad $111_1$, is electrically connected to the wiring 112. The pads 111 and the wiring 112 may be made of a material such as copper (Cu) or the like, for example. The pads 111 and the wiring 112 may have a thickness of approximately 10 μm to approximately 30 μm, for example. Gold (Au) plating or the like may be provided on the surfaces of the pads 111 and the wiring 112, if necessary.

A size of each of the surge withstand chip resistors 105 and 115 may be determined based on specifications of a current that flows or the like, whether a standard is to be satisfied, or the like. For example, the surge withstand chip resistors 105 and 115 may have a 6332-size such that the planar shape is a rectangular shape that is 6.3 mm×3.2 mm.

The solder resist layer 113 is formed on the other surface $110b$ of the insulator layer 110, so as to cover the wiring 112. As described above, however, the illustration of the solder resist layer 113 is omitted in FIG. 3. The solder resist layer 113 may be made of a photosensitive material such as an epoxy insulating resin, an acrylic insulating resin, or the like, for example. The solder resist layer 113 may have a thickness of approximately 10 μm to approximately 30 μm, for example.

The insulator layer 120 is arranged between the insulator layer 100 and the insulator layer 110, and bonds the other surface $100b$ of the insulator layer 100 to the one surface $110a$ of the insulator layer 110. The insulator layer 120 covers the shield wiring 108. The insulator layer 120 may be made of an insulating resin, such as an epoxy resin, a polyimide resin, or the like, for example. The insulator layer 120 may have a thickness of approximately 20 μm to approximately 70 μm, for example.

The wiring 121 is a via wiring that connects the other pad $101_2$ of the pads 101 and the other pad $111_2$ of the pads 111 to the same potential, by penetrating the pad $101_2$, the insulator layer 100, the insulator layer 120, the insulator layer 110, and the pad $111_2$. The wiring 121 may be made of a material such as copper (Cu) or the like, for example. The wiring 121 is an example of a wiring that connects the pad $101_2$ and the pad $111_2$ to the same potential, and does not necessarily have to be a via wiring. For example, the wiring 121 may be formed on a side surface or the like of the insulating substrate S1, to connect the pad $101_2$ and the pad $111_2$ to the same potential.

In the protection circuit module 10, the surge withstand chip resistor 105 and the surge withstand chip resistor 115 are mounted at positions that overlap in the plan view. In addition, the shield wiring 108 is provided on the inner layer of the insulating substrate S1, and is arranged in a region in which at least the pad $101_1$ and the pad $111_1$ oppose each other.

In the protection circuit module 10, the pads 101, the wiring 102, the surge withstand chip resistor 105, the pads 111, the wiring 112, the surge withstand chip resistor 115, the wiring 121, and the shield wiring 108 form one protection circuit. A plurality of protection circuits having the same structure as the one protection circuit described above may be provided on the insulating substrate S1. FIG. 2 and FIG. 3 illustrate an example in which two protection circuits having the same structure are provided on the insulating substrate S1.

The shield wiring 108 may be formed to span a plurality of protection circuits. In this case, the shield wiring 108 is shared among the plurality of protection circuits by the plurality of pads 101, the wiring 102, the surge withstand chip resistor 105, the plurality of pads 111, the wiring 112, the surge withstand chip resistor 115, and the wiring 121 that are provided.

When manufacturing the protection circuit module 10, a base material that is prepared may have a copper film formed on both surfaces of the insulator layer 100 that is made of a polyimide resin or the like, for example. Then, the copper film on both surfaces of the insulator layer 100 are etched to form the pads 101, the wiring 102, and the shield wiring 108. Thereafter, a photosensitive resin is coated to cover the pads 101 and the wiring 102, and the photosensitive resin is exposed and developed to form the solder resist layer 103 that exposes the pads 101 and covers the wiring 102.

The insulator layer 110, including the pads 111, the wiring 112, and the solder resist layer 113, is formed in a similar manner. Then, the insulator layer 100 and the insulator layer 110 are arranged so that the wiring 102 and the wiring 112 face toward the outside, and the insulator layer 120 made of an insulating resin or the like in a semi-cured state, for example, is sandwiched between the insulator layer 100 and the insulator layer 110. Next, a through-hole that penetrates the pad $101_2$, the insulator layer 100, the insulator layer 120, the insulator layer 110, and the pad $111_2$ is formed by drilling, laser beam machining, or the like, and copper or the like is filled into the through-hole by plating or the like, to form the wiring 121. Thereafter, the surge withstand chip resistor 105 is mounted on the pads 101 and the surge withstand chip resistor 115 is mounted on the pads 111, using solder, conductive paste, or the like, to complete the protection circuit module 10.

Figure 4:
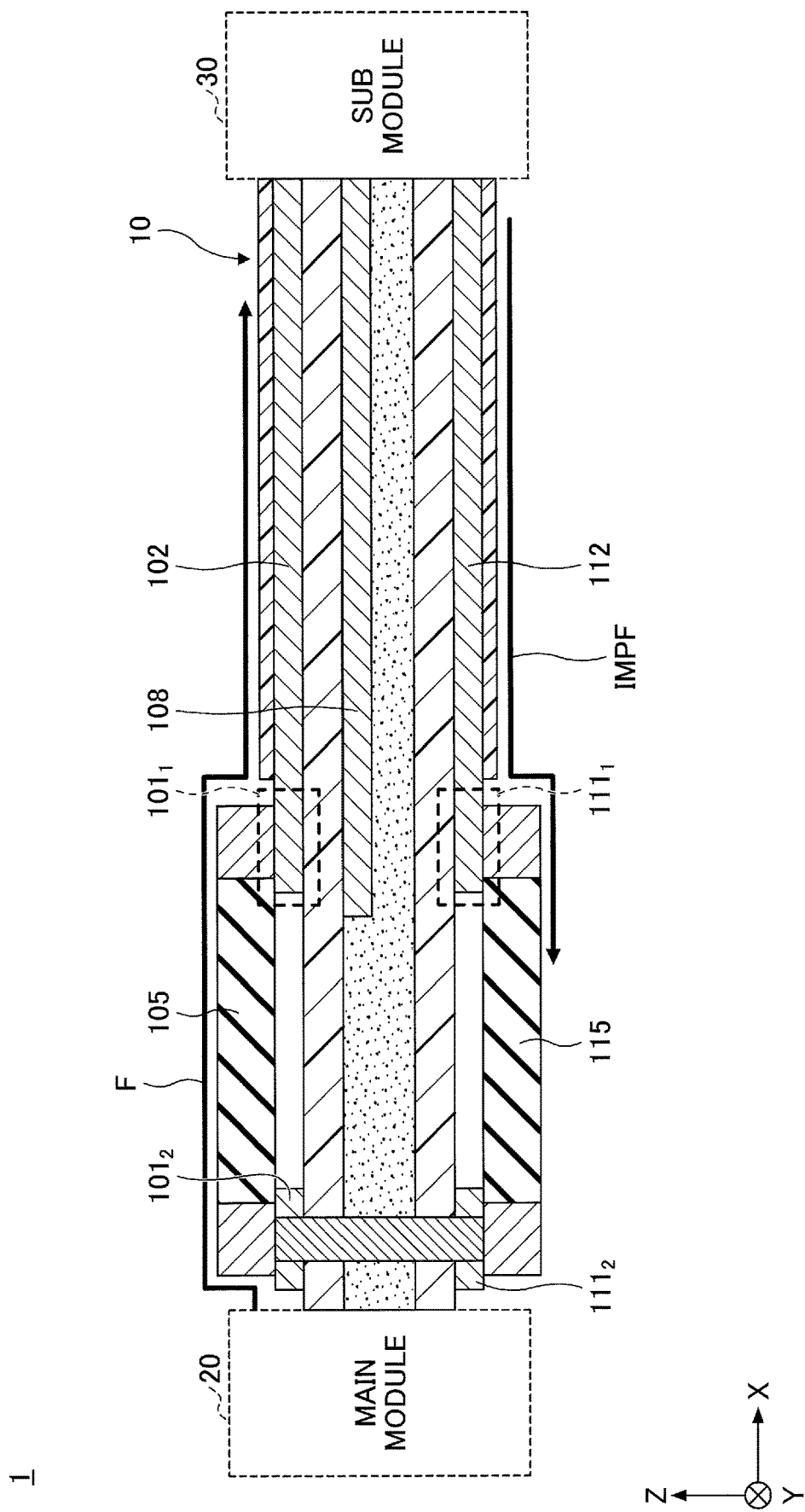
FIG. 4 is a diagram for explaining a signal flow in the electronic device in the first embodiment.

FIG. 4 is a diagram for explaining a signal flow in the electronic device in the first embodiment. As illustrated in FIG. 4, in the electronic device 1, a first signal F is supplied from the main module 20 to the pad $101_2$. The first signal F supplied to the pad $101_2$ is acquired by the sub module 30 via the surge withstand chip resistor 105, the pad $101_1$, and the wiring 102. On the other hand, a second signal IMPF is supplied from the sub module 30 to the wiring 112. The second signal IMPF supplied to the wiring 112 reaches the surge withstand chip resistor 115 via the pad $111_1$.

The second signal IMPF is an AC signal having a predetermined frequency on the order of several tens of kHz, for example. On the other hand, the first signal F is a detection signal that is output from the main module 20 and has an amplitude smaller than an amplitude of the second signal IMPF. In other words, the first signal F is an extremely weak signal.

Figure 5:
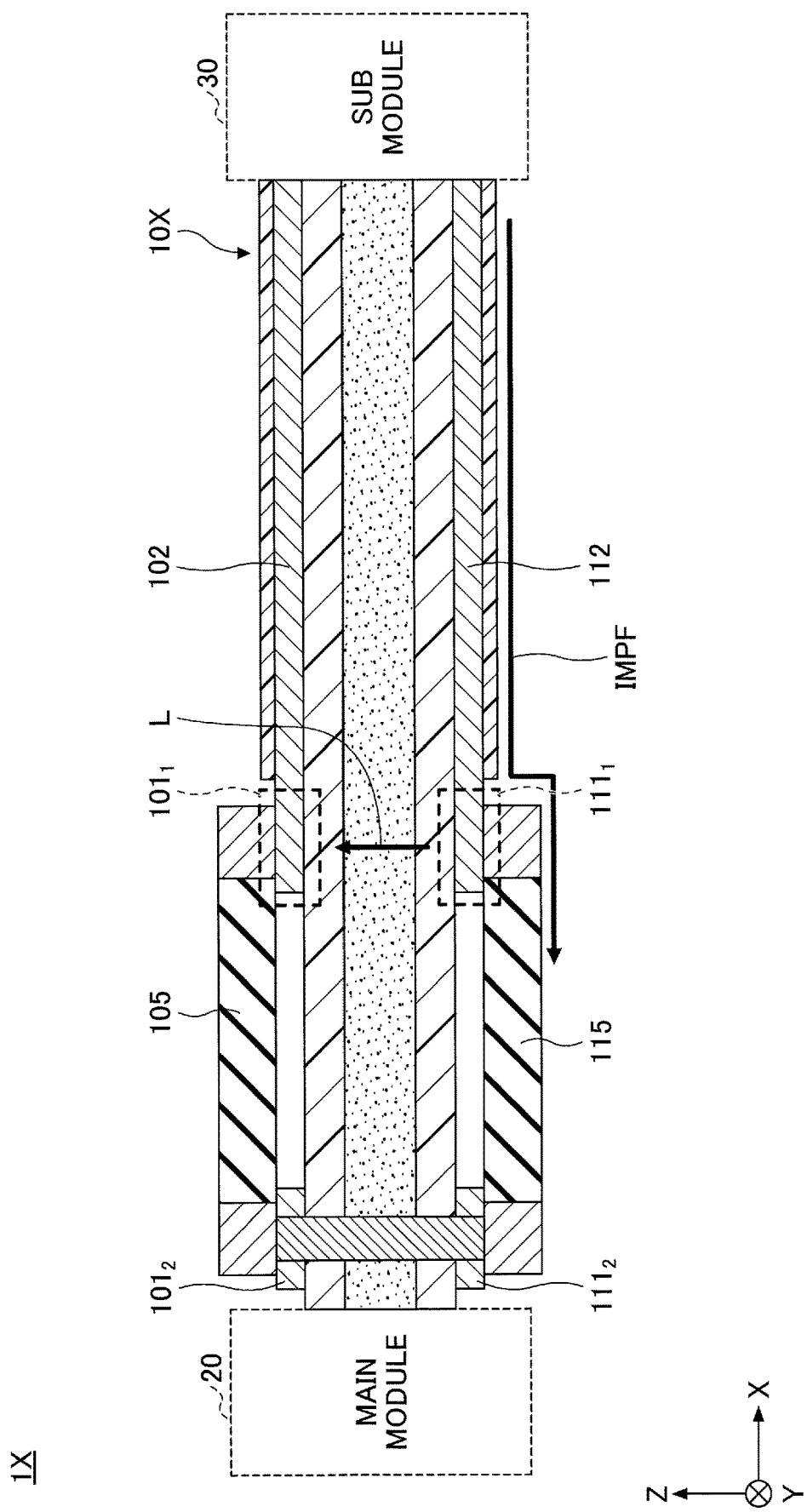
FIG. 5 is a diagram for explaining a signal flow in an electronic device in a comparison example.

FIG. 5 is a diagram for explaining a signal flow in an electronic device in a comparison example. In this comparison example, an electronic device 1X includes a protection circuit module 10X that is similar to the protection circuit module 10 except that the shield wiring 108 is not provided in the protection circuit module 10X. In the electronic device 10X, a case is considered in which the second signal IMPF is supplied from the sub module 30 to the wiring 112, but the first signal F is not supplied from the main module 20 to the pad $101_2$. In this case, because no shield wiring 108 is provided in the protection circuit module 10X, a capacitance-coupling is generated between the pad $111_1$ and the pad $101_1$. For this reason, crosstalk is generated when the second signal IMPF having the relatively large amplitude reaches the pad $111_1$ via the wiring 112. The second signal IMPF that reaches the pad $111_1$ propagates to the pad $101_1$ as indicated by an arrow L, and noise appears at the pad $101_1$.

Figure 6:
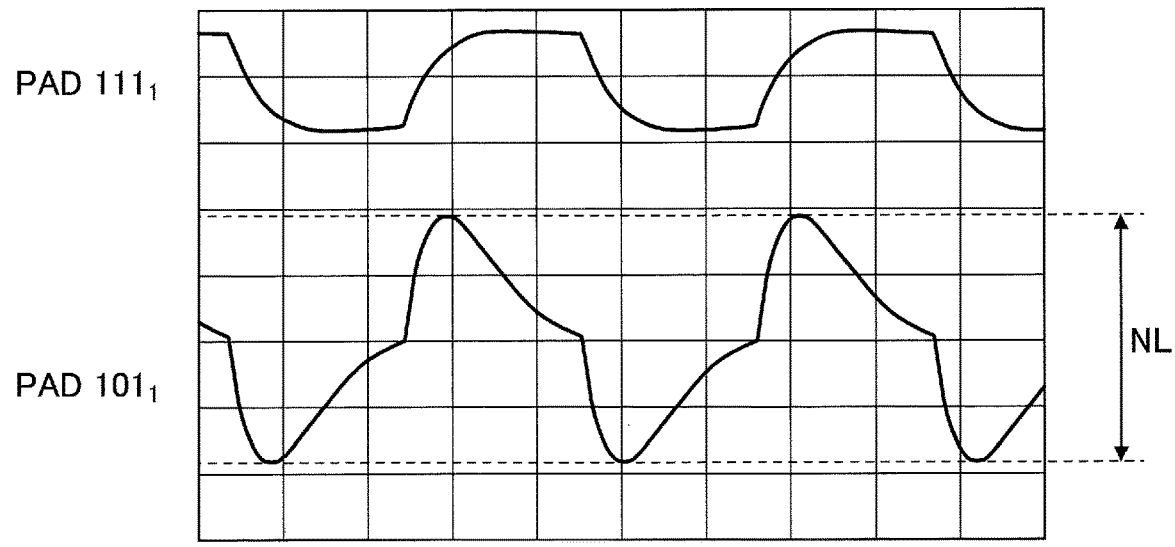
FIG. 6 is a diagram illustrating examples of a signal waveform and a noise waveform in the electronic device in the comparison example.

FIG. 6 is a diagram illustrating examples of a signal waveform and a noise waveform in the electronic device in the comparison example. More particularly, FIG. 6 illustrates examples of waveforms monitored at the pad $101_1$ and the pad $111_1$ of the protection circuit module 10X in the comparison example. In FIG. 6, an upper waveform is the waveform of the second signal IMPF that reached the pad $111_1$, and a lower waveform is the noise waveform propagated to the pad $101_1$. In FIG. 6, NL denotes an amplitude of the noise waveform propagated to the pad $101_1$.

On the other hand, in the electronic device 1 that includes the protection circuit module 10, the shield wiring 108 is arranged in the region in which at least the pad $101_1$ and the pad $111_1$ oppose each other. For this reason, the capacitance-coupling between the pad $111_1$ and the pad $101_1$ is shielded by the shield wiring 108, and it is possible to reduce the crosstalk between the pad $111_1$ and the pad $101_1$.

Figure 7:
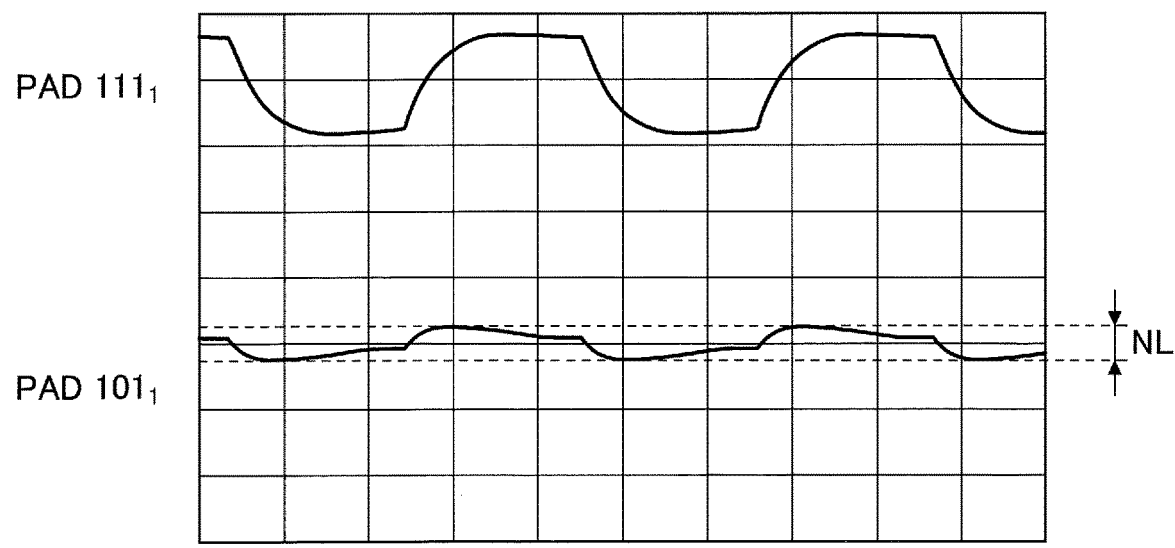
FIG. 7 is a diagram illustrating examples of a signal waveform and a noise waveform in the electronic device in the first embodiment.

FIG. 7 is a diagram illustrating examples of a signal waveform and a noise waveform in the electronic device in the first embodiment. More particularly, FIG. 7 illustrates examples of waveforms monitored at the pad $101_1$ and the pad $111_1$ of the protection circuit module 10 in this embodiment. FIG. 7 illustrates the waveforms in the same range as FIG. 6. In FIG. 7, an upper waveform is the waveform of the second signal IMPF that reached the pad $111_1$, and a lower waveform is the noise waveform propagated to the pad $101_1$. By arranging the shield wiring 108 in the region in which at least the pad $101_1$ and the pad $111_1$ oppose each other, an amplitude NL of the noise waveform propagated to the pad $101_1$, as illustrated in FIG. 7, can be reduced to approximately 1/7 the amplitude NL illustrated in FIG. 6.

Particularly in the case in which the surge withstand chip resistors 105 and 115 have the 6332-size that is relatively large, the size of the pad $101_1$ and the pad $111_1$ inevitably becomes large, to generate a strong capacitance-coupling between the pad $101_1$ and the pad $111_1$. Consequently, the effects of providing the shield wiring 108 becomes notable particularly when the shield wiring 108 is arranged in the region in which at least the pad $101_1$ and the pad $111_1$ oppose each other.

In addition, the shield wiring 108 preferably extends to a periphery from the region in which the pad $101_1$ and the pad $111_1$ oppose each other, and is formed in an area that is as large as possible on the other surface 100b of the insulator layer 100. By arranging the wiring 102 and the wiring 112 in the region overlapping the shield wiring 108 in the plan view, it is possible to reduce the noise generated between the wiring 102 and the wiring 112, and also reduce effects of incoming external noise.

A distance between opposing surfaces of the pad $101_1$ and the shield wiring 108 is preferably shorter than a distance between opposing surfaces of the pad $111_1$ and the shield wiring 108. This is because the closer the shield wiring 108 is to the pad $101_1$ that is the noise reducing target, the greater the noise reducing effect that is obtained.

However, depending on design constraints or the like, the distance between the opposing surfaces of the pad $101_1$ and the shield wiring 108 may be the same as the distance between opposing surfaces of the pad $111_1$ and the shield wiring 108.

Further, in addition to the shield wiring 108, a shield wiring having a planar shape similar to the planar shape of the shield wiring 108 may be provided on the one surface 110a of the insulator layer 110. However, when placing importance on the flexibility of the protection circuit module 10, it is more preferable that the protection circuit module 10 has the structure in which only the shield wiring 108 is provided and the additional shield wiring is not provided.

Accordingly, the size of the protection circuit module 10 can be reduced by mounting the surge withstand chip resistor 105 and the surge withstand chip resistor 115 at the positions that overlap in the plan view. In addition, the crosstalk noise that is generated due to adverse effects of reducing the size of the protection circuit module 10 can be reduced by arranging the shield wiring 108 in the region in which at least the pad $101_1$ and the pad $111_1$ oppose each other. Hence, it is possible to prevent a detection signal that is supplied from the main module 20 from becoming buried in the noise.

Second Embodiment

In a second embodiment, a rigid substrate is used as the insulator layer forming the protection circuit module. In the second embodiment, a description of those parts that are the same as those corresponding parts of the first embodiment described above may be omitted.

Figure 8:
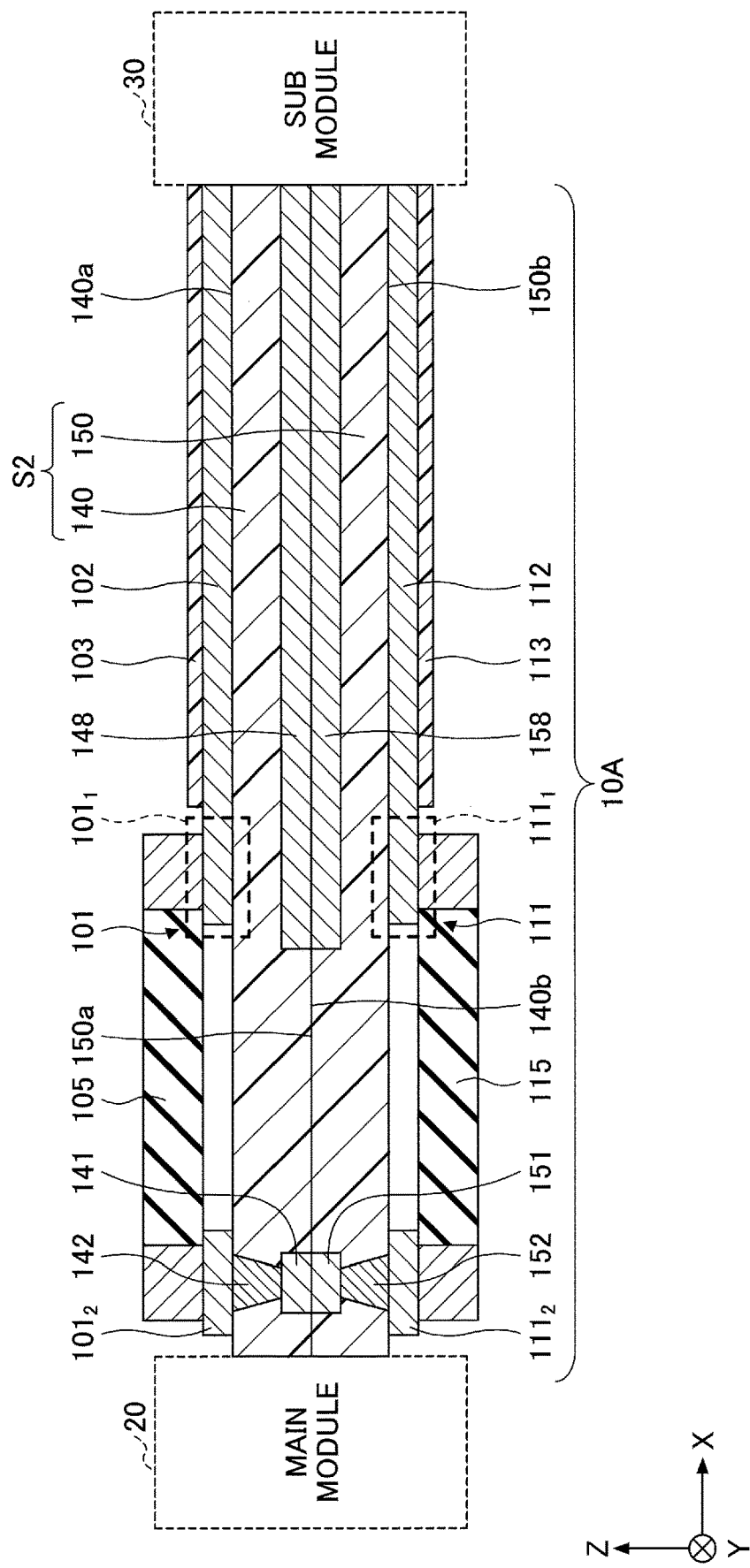
FIG. 8 is a cross sectional view illustrating an example of the electronic device in a second embodiment.

FIG. 8 is a cross sectional view illustrating an example of the electronic device in the second embodiment. As illustrated in FIG. 8, an electronic device 1A differs from the electronic device 1 illustrated in FIG. 1 through FIG. 3, in that the electronic device 1A includes a protection circuit module 10A in place of the protection circuit module 10.

In the protection circuit module 10A, insulator layers 140 and 150 forming an insulating substrate S2 are formed using a rigid material, such a so-called glass epoxy substrate or the like in which a glass cloth is impregnated by a thermosetting insulating resin, such as an epoxy resin or the like, for example. Each of the insulator layers 140 and 150 may have a thickness of approximately 10 µm to approximately 50 µm, for example.

Similarly as in the case of the protection circuit module 10, the pads 101, the wiring 102, and the solder resist layer 103 are formed on one surface 140a of the insulator layer 140 (one surface of the insulating substrate S2). The surge withstand chip resistor 105 is mounted on the pads 101 using solder, conductive paste, or the like, not illustrated in FIG. 8.

A via receiving pad 141 and a shield wiring 148 are embedded in another surface 140b of the insulator layer 140. The pad $101_2$ and the via receiving pad 141 are electrically connected via a via wiring 142. The via receiving pad 141, the via wiring 142, and the shield wiring 148 may be made of a material such as copper (Cu) or the like, for example. The via receiving pad 141 and the shield wiring 148 may have a thickness of approximately 10 µm to approximately 30 µm, for example.

In the plan view, outer peripheral edges of the via receiving pads 141 and 151 are formed on an inner side than outer peripheral edges of the pads $101_2$ and $111_2$. In other words, the via receiving pads 141 and 151 are arranged in the region in which the pads $101_2$ and $111_2$ overlap in the plan view, and the diameter of the via receiving pads 141 and 151 is smaller than the diameter of the pads $101_2$ and $111_2$.

Similarly as in the case of the protection circuit module 10, the pads 111, the wiring 112, and the solder resist layer 113 are formed on the other surface 150b of the insulator layer 150 (the other surface of the insulating substrate S2). The surge withstand chip resistor 115 is mounted on the pads 111 using solder, conductive paste, or the like, not illustrated in FIG. 8.

A via receiving pad 151 and a shield wiring 158 are embedded in one surface 150a of the insulator layer 150. The pad $111_2$ and the via receiving pad 151 are electrically connected via a via wiring 152. The via receiving pad 151, the via wiring 152, and the shield wiring 158 may be made of a material such as copper (Cu) or the like, for example. The via receiving pad 151 and the shield wiring 158 may have a thickness of approximately 10 µm to approximately 30 µm, for example.

The via receiving pad 141 and the via receiving pad 151 are arranged at positions that overlap in the plan view, and the via receiving pads 141 and 151 are electrically connected to each other. In addition, the shield wiring 148 and the shield wiring 158 are arranged at positions that overlap in the plan view, and the shield wirings 148 and 158 are electrically connected to each other. A stacked structure formed by the shield wiring 148 and the shield wiring 158 is arranged at a center along a direction in which a thickness of the insulating substrate S2 is taken. In other words, a distance between opposing surfaces of the pad $101_1$ and the shield wiring 148 and a distance between opposing surfaces of the pad $111_1$ and the shield wiring 158 are the same.

Hence, the rigid substrate may be used as the insulator layers 140 and 150 forming the protection circuit module 10A. In this case, the size of the protection circuit module 10A can be reduced by mounting the surge withstand chip resistor 105 and the surge withstand chip resistor 115 at positions that overlap in the plan view.

In addition, the crosstalk noise that is generated due to adverse effects of reducing the size of the protection circuit module 10A can be reduced by arranging the stacked structure of the shield wiring 148 and the shield wiring 158 in the region in which at least the pad $101_1$ and the pad $111_1$ oppose each other. Hence, it is possible to prevent the detection signal that is supplied from the main module 20 from becoming buried in the noise.

Therefore, according to the embodiments described above, it is possible to provide a protection circuit module, and an electronic device including the protection circuit module, that can reduce crosstalk between wirings.

The description above use terms such as "determine", "predetermined", or the like to describe the embodiments, however, such terms are abstractions of the actual operations that are performed. Hence, the actual operations that correspond to such terms may vary depending on the implementation, as is obvious to those skilled in the art.

Although the embodiments are numbered with, for example, "first," or "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, in the protection circuit module 10A, the via receiving pads 141 and 151 may be integrally formed by a metal. Similarly, the shield wirings 148 and 158 may be integrally formed by a metal.

What is claimed is:

1. A protection circuit module comprising:
   an insulating substrate including one surface, and another surface opposite to the one surface;
   a first surge withstand chip resistor mounted on a pair of first pads formed on the one surface of the insulating substrate;
   a second surge withstand chip resistor mounted on a pair of second pads formed on the other surface of the insulating substrate, and arranged at a position on the other surface of the insulating substrate overlapping the first surge withstand chip resistor in a plan view;
   a first wiring coupled to one of the pair of first pads;
   a second wiring coupled to one of the pair of second pads;
   a third wiring coupling the other of the pair of first pads and the other of the pair of second pads to the same potential; and
   a shield wiring, provided on an inner layer of the insulating substrate, and arranged in a region in which at least the one of the pair of first pads and the one of the pair of second pads oppose each other.

2. The protection circuit module as claimed in claim 1, wherein a distance between opposing surfaces of the one of the pair of first pads and the shield wiring is shorter than a distance between opposing surfaces of the one of the pair of second pads and the shield wiring.

3. The protection circuit module as claimed in claim 2, wherein
   the insulating substrate includes a first insulator layer including a first surface forming the one surface of the insulating substrate and formed with the pair of first pads, a second insulator layer including a second surface forming the other surface of the insulating substrate and formed with the pair of second pads, and a third insulator layer bonding the first insulator layer to the second insulator layer, and
   the shield wiring is formed on a surface of the first insulator layer opposite to the first surface, and is covered by the third insulator layer.

4. The protection circuit module as claimed in claim 1, wherein
   the first wiring is configured to supply a first signal,
   the second wiring is configured to supply a second signal, and
   the first signal has an amplitude smaller than an amplitude of the second signal.

5. The protection circuit module as claimed in claim 1, wherein
   the shield wiring extends in a periphery from the region in which at least the one of the pair of first pads and the one of the pair of second pads oppose each other, and
   the first wiring and the second wiring are arranged in a region overlapping the shield wiring in the plan view.

6. The protection circuit module as claimed in claim 1, wherein
   the pair of first pads, the first surge withstand chip resistor, the pair of second pads, the second surge withstand chip resistor, the first wiring, the second wiring, the third wiring, and the shield wiring form one protection circuit, and
   another protection circuit having a structure identical to a structure of the one protection circuit is provided on the insulating substrate.

7. The protection circuit module as claimed in claim 6, wherein the shield wiring is shared among a plurality of protection circuits, including the one protection circuit and the other protection circuit.

8. The protection circuit module as claimed in claim 2, wherein
   the first wiring is configured to supply a first signal,
   the second wiring is configured to supply a second signal, and
   the first signal has an amplitude smaller than an amplitude of the second signal.

9. The protection circuit module as claimed in claim 2, wherein
   the shield wiring extends in a periphery from the region in which at least the one of the pair of first pads and the one of the pair of second pads oppose each other, and
   the first wiring and the second wiring are arranged in a region overlapping the shield wiring in the plan view.

10. The protection circuit module as claimed in claim 2, wherein
    the pair of first pads, the first surge withstand chip resistor, the pair of second pads, the second surge withstand chip resistor, the first wiring, the second wiring, the third wiring, and the shield wiring form one protection circuit, and
    another protection circuit having a structure identical to a structure of the one protection circuit is provided on the insulating substrate.

11. The protection circuit module as claimed in claim 10, wherein the shield wiring is shared among a plurality of protection circuits, including the one protection circuit and the other protection circuit.

12. An electronic device comprising:
    a protection circuit module according to claim 1;
    a main module configured to supply a first signal to the other of the pair of first pads of the protection circuit module; and
    a sub module configured to acquire the first signal via the first surge withstand chip resistor and the first wiring, and supply a second signal to the second wiring,
    wherein the shield wiring of the protection circuit module is connected to a reference potential of at least one of the main module and the sub module.

13. The electronic device as claimed in claim 12, wherein the second signal is an AC signal.

14. The electronic device as claimed in claim 12, wherein the first signal has an amplitude smaller than an amplitude of the second signal.

15. The electronic device as claimed in claim 12, wherein a distance between opposing surfaces of the one of the pair of first pads and the shield wiring is shorter than a distance between opposing surfaces of the one of the pair of second pads and the shield wiring.

16. The electronic device as claimed in claim 15, wherein
    the insulating substrate includes a first insulator layer including a first surface forming the one surface of the insulating substrate and formed with the pair of first pads, a second insulator layer including a second surface forming the other surface of the insulating substrate and formed with the pair of second pads, and a third insulator layer bonding the first insulator layer to the second insulator layer, and
    the shield wiring is formed on a surface of the first insulator layer opposite to the first surface, and is covered by the third insulator layer.

17. The electronic device as claimed in claim 12, wherein
    the first wiring is configured to supply a first signal,
    the second wiring is configured to supply a second signal, and
    the first signal has an amplitude smaller than an amplitude of the second signal.

18. The electronic device as claimed in claim 12, wherein the shield wiring extends in a periphery from the region in which at least the one of the pair of first pads and the one of the pair of second pads oppose each other, and the first wiring and the second wiring are arranged in a region overlapping the shield wiring in the plan view.

* * * * *

UNITED STATES PATENT AND TRADEMARK OFFICE
CERTIFICATE OF CORRECTION

PATENT NO. : 10,798,815 B2  
APPLICATION NO. : 16/213056  
DATED : October 6, 2020  
INVENTOR(S) : Tatsuaki Denda, Norihito Konno and Minori Hosoi Page 1 of 1

It is certified that error appears in the above-identified patent and that said Letters Patent is hereby corrected as shown below:

On the Title Page

Please correct the item (73) Assignee  
To:  
"SHINKO ELECTRIC INDUSTRIES CO., LTD., Nagano (JP);  
NIHON KOHDEN CORPORATION, Tokyo (JP)"  
From:  
"SHINKO ELECTRIC INDUSTRIES CO., LTD., Nagana (JP);  
NIHON KOHDEN CORPORATION, Tokyo (JP)"

Signed and Sealed this  
Twenty-sixth Day of January, 2021

Drew Hirshfeld  
*Performing the Functions and Duties of the*  
*Under Secretary of Commerce for Intellectual Property and*  
*Director of the United States Patent and Trademark Office*